United States Patent
Fujishiro et al.

(10) Patent No.: US 11,386,949 B2
(45) Date of Patent: *Jul. 12, 2022

(54) APPARATUSES, SYSTEMS, AND METHODS FOR LATCH RESET LOGIC

(71) Applicant: MICRON TECHNOLOGY, INC., Boise, ID (US)

(72) Inventors: Keisuke Fujishiro, Sagamihara (JP); Yoshifumi Mochida, Sagamihara (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/301,479

(22) Filed: Apr. 5, 2021

(65) Prior Publication Data

US 2021/0249067 A1   Aug. 12, 2021

Related U.S. Application Data

(63) Continuation of application No. 16/785,338, filed on Feb. 7, 2020, now Pat. No. 10,998,039.

(51) Int. Cl.
*G11C 11/4093* (2006.01)
*G11C 11/4076* (2006.01)
*G11C 11/406* (2006.01)

(52) U.S. Cl.
CPC ...... *G11C 11/4093* (2013.01); *G11C 11/4076* (2013.01); *G11C 11/40615* (2013.01)

(58) Field of Classification Search
CPC ............ G11C 11/4093; G11C 11/4076; G11C 11/40615; G11C 11/4096; G11C 11/4072; G11C 7/1039; G11C 7/106; G11C 7/1087; G11C 7/20; G11C 7/222; G11C 16/105

See application file for complete search history.

(56) References Cited

U.S. PATENT DOCUMENTS 9,953,700 B2   4/2018   Kim

OTHER PUBLICATIONS

U.S. Appl. No. 16/785,338, titled "Apparatuses, Systems, and Methods for Latch Reset Logic", dated Feb. 7, 2020, pp. all.

*Primary Examiner* — Sultana Begum
(74) *Attorney, Agent, or Firm* — Dorsey & Whitney LLP

(57) ABSTRACT

Apparatuses, systems, and methods for latch reset logic. Banks may have local latches which are coupled between a global data bus and the bank. Some of the local latches may be shared local latches which are coupled to a first bank and a second bank. The shared latches may latch data responsive to a first clock signal and a second clock signal, and may reset responsive to a combined reset signal. A reset logic circuit may receive the clock signals and a first and second reset signal. The reset logic circuit may provide the combined reset signal based on the first and second clock signals and reset signals. The clocks signals may be column active commands and the reset signals may be waveforms (e.g., falling edges) of row active commands used as part of access operations on the first or the second memory bank.

20 Claims, 8 Drawing Sheets

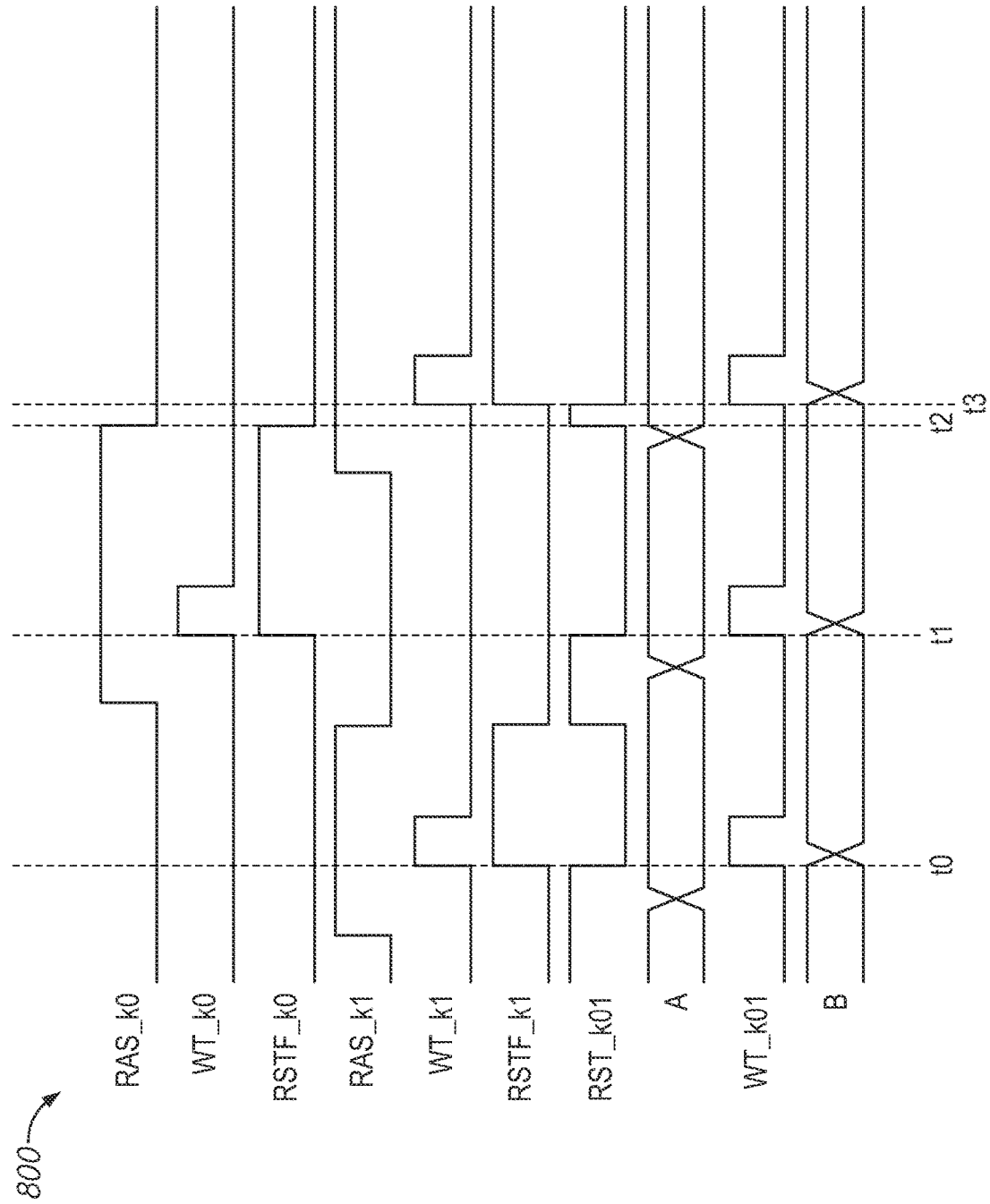

APPARATUSES, SYSTEMS, AND METHODS FOR LATCH RESET LOGIC

CROSS REFERENCE TO RELATED APPLICATION(S)

This application is a continuation of U.S. patent application Ser. No. 16/785,338 filed Feb. 7, 2020 and issued as U.S. Pat. No. 10,998,039 on May 4, 2021. The aforementioned application, and issued patent, is incorporated herein by reference, in its entirety, for any purpose.

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. The memory array may be organized into a number of banks. During memory operations, one or more banks may be activated, and information may be, for example, read from or written to memory cells of the activated bank(s). To save on space, power, etc., certain components of the memory may be shared by multiple banks.

BRIEF DESCRIPTION OF THE DRAWINGS

FIG. 8 is a timing diagram of an example operation of reset logic and a reset latch according to some embodiments of the present disclosure.

DETAILED DESCRIPTION

Figure 1:
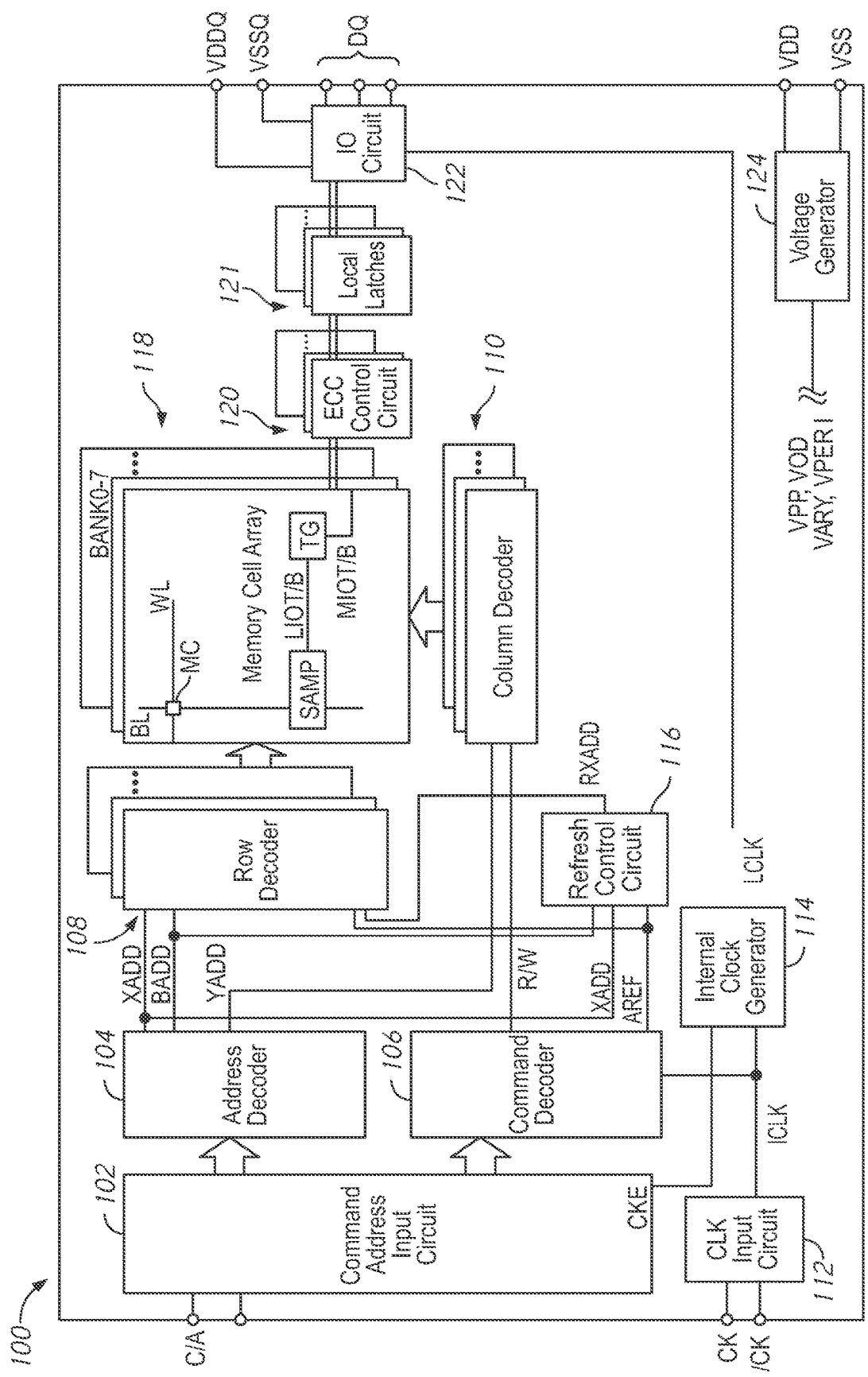
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During an access operation, such as a read or write operation, a row may be activated, and data may be read from, or written to, the memory cells along the activated row. The memory cells may be organized into banks. When an access operation is performed, it may be directed to a particular bank, and one or more rows in the specified bank may be activated and data may be provided (or received) along digit lines. The digit lines may be coupled to local latches, which may receive (or provide) the data from a global data bus. A clock signal may cause the local latch to latch data from the global bus (or from the memory bank) and a reset signal may cause the local latch to reset when the stored value is no longer needed. The clock signals and reset signals may be specific to one of the banks (e.g., a first reset signal for a first bank, a second reset signal for a second bank, etc.).

In order to improve the performance of the memory (e.g., to reduce power consumption, to reduce space, etc.) the local latches may be shared between a pair of banks. Accordingly, the latches may need to respond to the clock and reset signals for both of the bank. The two reset signals may be received by a reset logic circuit, which may provide a combined reset signal. If the two reset signals rapidly change states (e.g., if the second signal activates shortly after the first signal deactivates), the reset logic may 'skip' an activation of the combined reset signal. For example, if the combined reset signal is stored in the reset logic, rapid changing of the inputs may lead to a metastable state. It may be desirable to ensure that the combined reset signal is properly provided, even when the two reset signals rapidly change states.

The present disclosure is directed to apparatuses, systems, and methods for latch reset logic. The reset logic may receive a first reset signal and a first clock signal associated with a first bank, and a second reset signal and a second clock signal associated with a second bank. The reset logic may provide the combined reset signal such that a falling edge of the combined reset signal may coincide with a rising edge of the first or the second clock signal. In this manner, the shared latch may not receive both an active clock signal and an active reset signal at the same time, which may cause undesirable behavior in the local latch. For example, the reset logic may have a first flip-flop circuit (FF circuit) which latches the first reset signal based on the first clock signal and a second FF circuit which latches the second reset signal based on the second clock signal. The combined reset signal may be provided based on the values stored in the first and the second FF circuits.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

In order to manage the timing of various memory operations, each of the banks of the memory array 118 may be associated with a set of local latches 121. The local latches 121 may store data associated with the memory bank, and may couple that stored data to a global data bus which couples the local latches 121 to the IO circuit 122 (and to the DQ pads). For example, the IO circuit 122 may receive data at the DQ pads and provide it along the global data bus to the local latches 121, which may then provide the data to the associated bank(s). The local latches 121 may receive clock signals which cause them to latch the data along the global data bus. The clock signals may, in some embodiments, be associated with particular operations (e.g., a write signal, a read signal) and may be specific to particular banks (e.g., a first clock associated with a first bank, a second clock associated with a second bank, etc.). Accordingly, a local latch may respond to the clock signal(s) associated with the bank(s) which are associated with that latch. Similarly, when the data in the local latch 121 is no longer needed, a reset signal may cause the latch to return to a neutral state. The reset signals may also be associated with particular operations and/or banks, and certain local latches may respond to particular ones of the reset signals. In some embodiments, the reset signals may be signals used by the memory for various operations, such as a pre-charge signal Pre used to close a wordline.

The clock and reset signals may represent waveforms of one or more signals used by the memory as part of access operations. In some embodiments, the reset signals may be part of a waveform of a signal used to activate a row in one of the selected banks. For example, the reset signals may be the failing edge (e.g., a transition from an active to an inactive state) of a row activation command such as ACT or RAS. In some embodiments, the clock signals may be column active command used to activate a digit line so data can be read off it or written along it. For example, the clock signals may be read signals RD or write signals WT. Other signals and other waveforms may be used in other examples.

Some of the local latches 121 may be shared local latches, which are associated with more than one of the banks. These local latches 121 may be activated to store data associated with any of the banks that the shared latch is associated with. Accordingly, the local latches which are shared may respond to signals (e.g., clock and reset signals) associated with any of the banks which are associated with that local latch. For example, if a particular local latch 121 is shared between a first and a second bank, then the shared local latch may respond to both the first and the second clock signal. One or more reset logic circuits may receive the reset signals associated with the banks shared by the shared latch, and may provide a combined reset signal to the shared latch. The reset logic and the operation of the reset logic and the combined reset signal are discussed in more detail herein.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data. The corrected read data is stored in the local latches 121 associated with the bank indicated by the bank address. The local latches 121 may then provide the corrected read data along a global data bus to the IO circuit 122. The corrected read data is output to outside the device 100 from the data terminals DQ via the input/output circuit 122. In some embodiments, the ECC circuit 120 may be omitted, and the read data may be provided directly to the local latches 121 (e.g., without parity bits).

The device 100 may receive an access command which is a write command. When the write command is received, and a bank address, a row address and a column address are timely supplied with the write command, and write data is supplied through the DQ terminals to the ECC control circuit 120. The write data is provided along the global data bus and saved in the local latches 121 associated with the bank indicated by the bank address. The write data stored in the local latches 121 is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the local latches 121 to the ECC control circuit 120. The ECC control circuit 120 may generate a number of parity bits based on the write data, and the write data and the parity bits may be provided to the memory array 118 to be written into the memory cells MC. In some embodiments, the ECC control circuit 120 may be omitted, and the data in the local latches 121 may be provided to the bank.

The optional ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit 122 and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. For example, the ECC control circuit 120 may be able to locate and correct up to one error in the 128 data bits based on the 8 parity bits. While various embodiments are discussed with reference to ECC circuits which use 8 parity bits to find one error in 128 data bits, it should be understood that these are for explanatory purposes only, and that other numbers of data bits, error bits, and parity bits may be used in other example embodiments.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAM included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
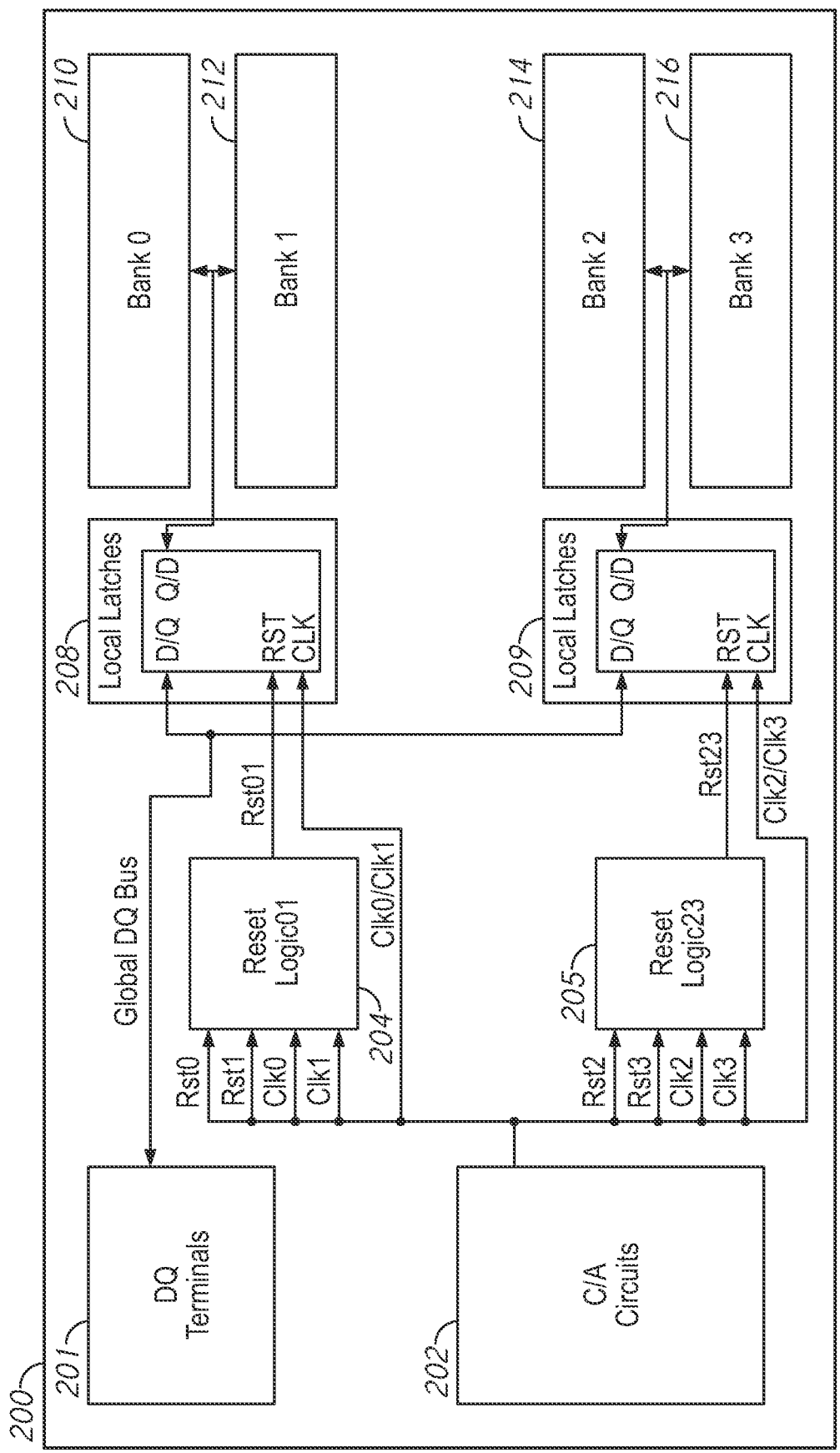
FIG. 2 is a block diagram of a memory including shared local latches according to some embodiments of the present disclosure.

FIG. 2 is a block diagram of a memory including shared local latches according to some embodiments of the present disclosure. The memory 200 may be a view of a memory, such as the memory device 100 of FIG. 1, which highlights the operation of the local latches and reset logic. The memory 200 may be a simplified view and various components of the memory 200 may be combined and/or simplified for the sake of clarity. For example, the C/A circuits 202 may include memory components such as the C/A input circuit (e.g., 102 of FIG. 1), row and column decoders e.g., 108 and 110 of FIG. 1), and/or command decoder (e.g., 106 of FIG. 1).

The memory 200 includes a first memory bank (Bank 0) 210, a second memory bank (Bank 1) 212, a third memory bank (Bank 2) 214, and a fourth memory bank (Bank 3) 216. Each of the memory banks 210-216 includes a number of memory cells arranged at the intersection of respective rows and columns. The first and the second bank 210 and 212 share a set of local latches 208, and the third and the fourth bank 214 and 216 share a set of local latches 209. For the purposes of clarity only a single latch is shown in detail in each of the sets of local latches 208 and 209, however each of the sets of local latches 208 and 209 may include multiple such latches.

The local latch 208 has a first input/output terminal (labelled D/Q) which is coupled to a global DQ bus. The global DQ bus is in turn coupled to the DQ terminals 201 (and to an input/output circuit not shown in FIG. 2). The local latch 208 has a second input/output terminal (labelled Q/D) which is coupled to the memory banks 210 and 212. The two input/output terminals are shown to represent that data may flow through the latch in different directions based on the operation. For example, if the local latch 208 is used as part of a write operation, then data may be provided along the global DQ bus, the first I/O terminal D/Q may be an input terminal, and the second I/O terminal QD may be an output terminal which provides the stored bit to the banks 210/212. If the local latch 208 is used as part of a read operation, then data may come from one of the banks 210/212 and the second I/O terminal Q/D may act as an input, while the first I/O terminal D/Q acts as an output terminal to the global DQ bus.

The C/A circuits 202 may provide various signals to the local latches 208 and 209. For example, the C/A circuit 202 may provide a first, second, third, and fourth reset signal Rst0-Rst4, each of which may be associated with a respective one of the four memory banks 210-216. Similarly, the C/A circuit 202 may provide clock signals Clk0-Clk4, each of which may be associated with a respective one of the four memory banks 210-216. The clock signals Clk0-Clk4 may represent any signal which is used to indicate that an access operation is being performed on the associated bank 210-216. For example, the clock signals Clk0-Clk4 may by column active command, such as read signals RD0-RD4, or write signals WT0-WT4. The reset and clock signals may be provided by the C/A circuits 202 responsive to a bank address indicating one of the banks 210-216 and a received access command. For example, if an read command is received along with a bank address which indicates the first bank 210, then the signals Clk0 and Rst0 may be provided.

The first clock signal Clk0 and the second clock signal Clk1 are provided to a clock terminal CLK of the first local latch 208. Responsive to an activation of the first clock signal Clk0 or the second clock signal Clk1, the first local latch 208 may latch a value (e.g., either from the global DQ bus or the first/second bank 210/212 depending on if the local latch is being used for a write or read operation). The third clock signal Clk2 and the fourth clock signal Clk3 are provided to a clock terminal CLK of the second local latch 209. The second local latch 209 may latch a value (e.g., either from the global DQ bus or the third/fourth bank 214/216 depending on if the local latch is being used for a write or read operation). When the clock signal coupled to the clock terminal CLK of the local latch 208 is active (e.g., at a high logical level), the local latch 208 may store the value on the input terminal D of the latch 208.

The C/A circuits 202 may also provide reset signals Rst0-Rst3, each of which is associated with a respective one of the banks 210-216. The reset signals may indicate that a particular access operation has ended, and that the value in the local latch 208/209 is no longer needed. For example, the pre-charge signal Pre may be used as a reset signal. For example, a falling edge of an access signal, such as a row active command (e.g., and activation signal such as ACT or RAS) may be used as the reset signal. The first and second reset signals Rst0 and Rst1 are received by a first reset logic circuit 204, which provides a first combined reset signal Rst01 based on the two reset signals Rst0 and Rst1. The first reset logic 204 also receives the clock signals Clk0 and Clk1 and uses these to clock the combined reset signal Rst01. The combined reset signal Rst01 is provided to a reset terminal RST of the local latch 208. When the combined reset signal Rst01 is active (e.g., at a high logical level) the latch 208 may reset to a neutral state. The reset logic circuit 204 may provide an activation of the combined reset signal Rst01 each time either the first or the second reset signal Rst0 or Rst1 is active. The reset logic circuit 204 may provide the combined reset signal Rst01 such that each falling edge of the combined reset signal Rst01 happens at about the same time as a rising edge of one of the clock signals Clk0 or Clk1. In some embodiments, the falling edge of the combined reset signal Rst01 may coincide with the rising edge of one of the clock signals Clk0 or Clk1. The second reset logic circuit 205 may function in a manner analogous to the reset logic circuit 204, except the reset logic circuit 205 provides a second combined reset signal Rst23 based on the reset signals Rst2 and Rst3 and the clock signals Clk2 and Clk3.

Figure 3:
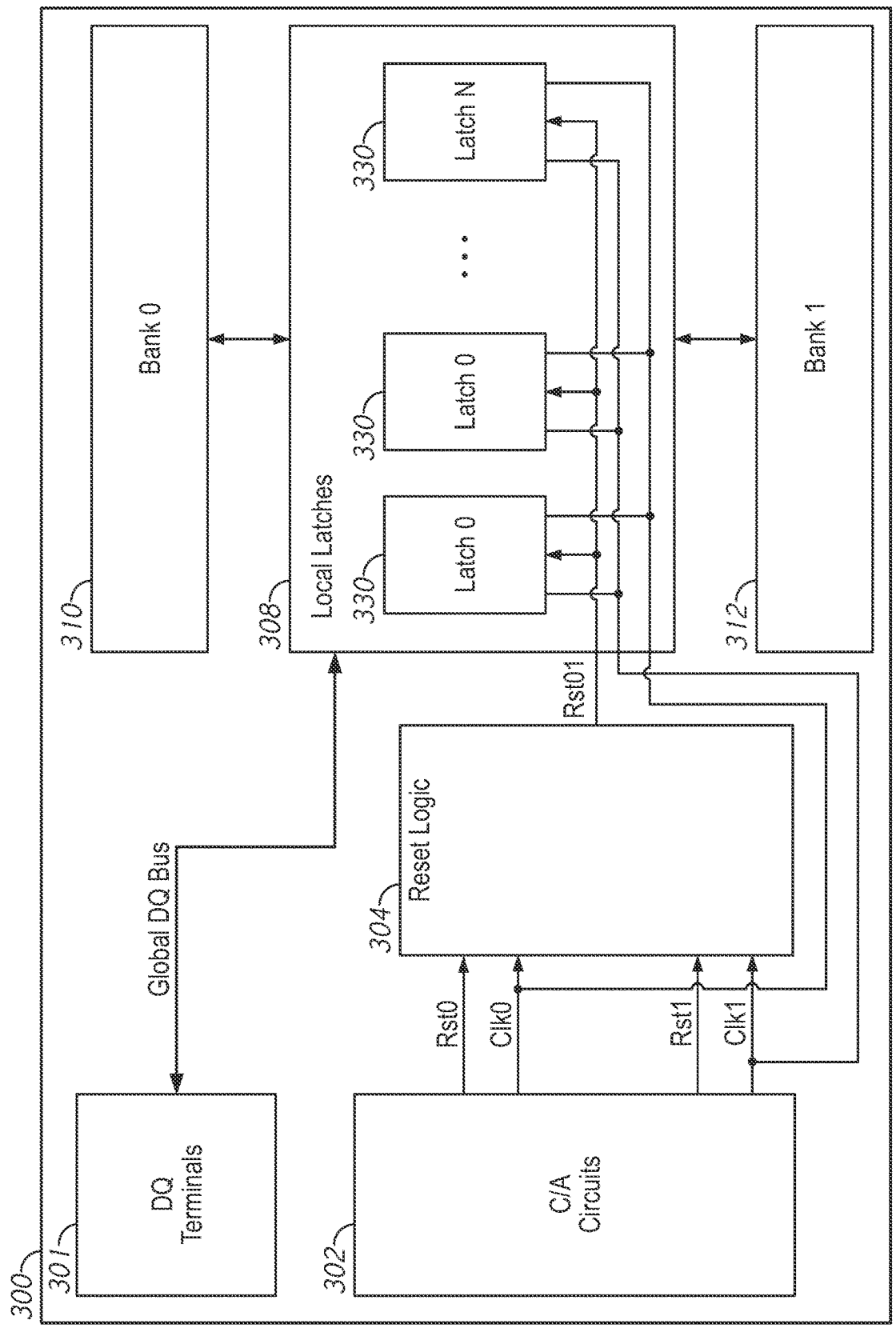
FIG. 3 is a block diagram of a memory with shared local latches according to some embodiments of the present disclosure.

FIG. 3 is a block diagram of a memory with shared local latches according to some embodiments of the present disclosure. The memory 300 may, in some embodiments, be included in the memory 200 of FIG. 2 and/or the memory device 100 of FIG. 1. The memory 300 may represent a more detailed view of a pair of memory banks 310 and 312 which share local latches 308 between them. For the sake of brevity features and operations previously described with respect to the memory 200 of FIG. 2 and/or the memory device 100 of FIG. 1 will not be repeated again with respect to FIG. 3.

The local latches 308 include a number of individual shared latches 330 (here labelled 0 to N) each of which is coupled to the first bank 310 and the second bank 312. The number of local latches 330 may, in some embodiments, be based on a number of bits which are transmitted along the global data bus. Each of the individual shared latches 330 is coupled in common to the combined reset signal Rst01, the first clock signal CLk0 and the second clock signal Clk1. In some embodiments, each of the local latches may be coupled to the two clock signals Clk0 and Clk1 through clock logic (not shown). For example, the first and the second clock signal may be coupled to the inputs of an OR gate, which may provide a combined clock signal Clk01 in common to each of the latches 330.

Figure 4:
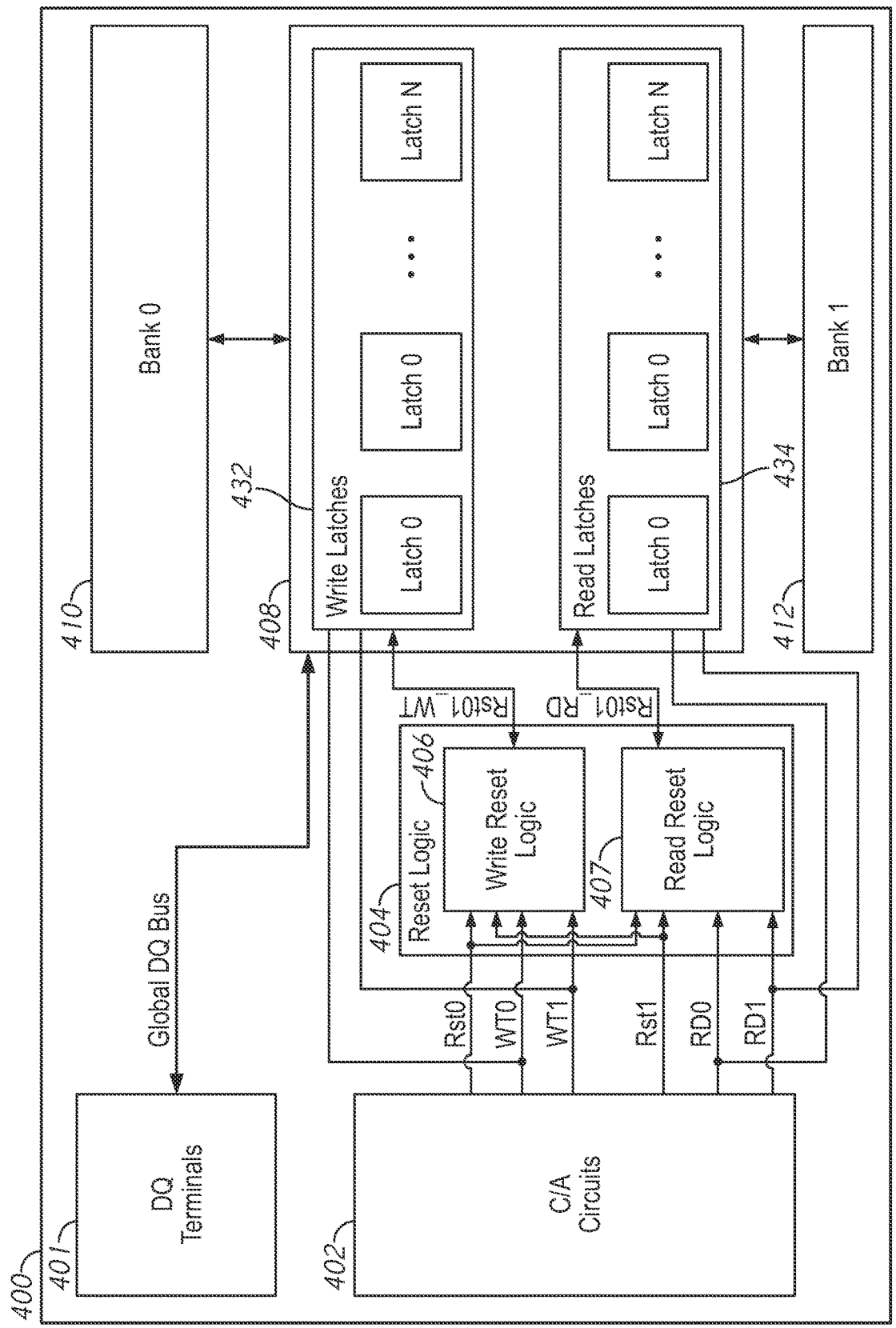
FIG. 4 is a block diagram of a memory with shared write latches and shared read latches according to some embodiments of the present disclosure.

FIG. 4 is a block diagram of a memory with shared write latches and shared read latches according to some embodiments of the present disclosure. The memory 400 of FIG. 4 may, in some embodiments, be included in the memories 100, 200, and/or 300 of FIGS. 1-3 respectively. For the sake of brevity, features and operations previously described with respect to the memory 300 of FIG. 3, the memory 200 of FIG. 2 and/or the memory device 100 of FIG. 1 will not be repeated again with respect to FIG. 4. The memory 400 of FIG. 4 shows a set of write latches 432 and a set of read latches 434 in the local latches 408.

The memory 400 has a set of shared write latches 432 which are used as part of write operations to the first memory bank 410 and the second memory bank 412, and a set of shared read latches 434 which are used as part of read operations on the first memory bank 410 and the second memory bank 412. The C/A circuits 402 may provide a first write clock WT0 and a second write clock WT1 which are associated with write operations to the first memory bank 410 and the second memory bank 412 respectively. The C/A circuits 402 may also provide read clocks RD0 and RD1 which are associated with read operations in the first and the second bank 410/412 respectively.

The reset logic 404 may have write reset logic 406, which provides a combined write reset signal Rst01_WT based on the two reset signals Rst0 and Rst1 and the two write clocks WT0 and WT1. The reset logic 404 includes read reset logic 507 which provides a combined read reset signal Rst01_RD based on the two reset signals Rst0 and Rst1 and the two read clocks RD0 and RD1. The write latches 432 may receive the combined write reset signal Rst01_WT and the write clocks WT0 and WT1 in common. The read latches 434 may receive the combined read reset signal Rst01_RD and the read clocks RD01 and RD1 in common.

The write latches 432 may store data from the global DQ bus responsive to an activation of either of the write clocks WT0 or WT1. The data stored in the write latches 432 may then be provided to the bank 410 or the bank 412 and written to the memory cells of the activated banks. Based on activation of the first reset signal Rst0 or the second reset signal Rst1, the write reset logic 406 may provide an activation of the combined write reset signal Rst01_WT. A falling edge of the write reset signal Rst01_WT may happen at about the same time as a rising edge of one of the write clocks signals WT0 or WT1. The activation of the combined write reset signal Rst01_WT may cause the write latches 432 to reset to a neutral state (e.g., to discard the currently stored data).

The read latches 434 may store data from either the bank 410 or the bank 412 responsive to an activation of one of the read clocks RD0 or RD1. The data stored in the read latches may then be read out along the global DQ bus to the DQ terminals 401 and provided off of the memory 400. Based on the activation of the first reset signal Rst0 or the second reset signal Rst1, the read reset logic 407 may provide an activation of the combined read reset signals Rst01_RD. A galling edge of the read reset signals Rst01_RD may happen at about the same time as a rising edge of one of the read clocks RD0 or RD1. The activation of the combined read reset signal Rst01_RD may cause the read latches 434 to reset to a neutral state.

Figure 5:
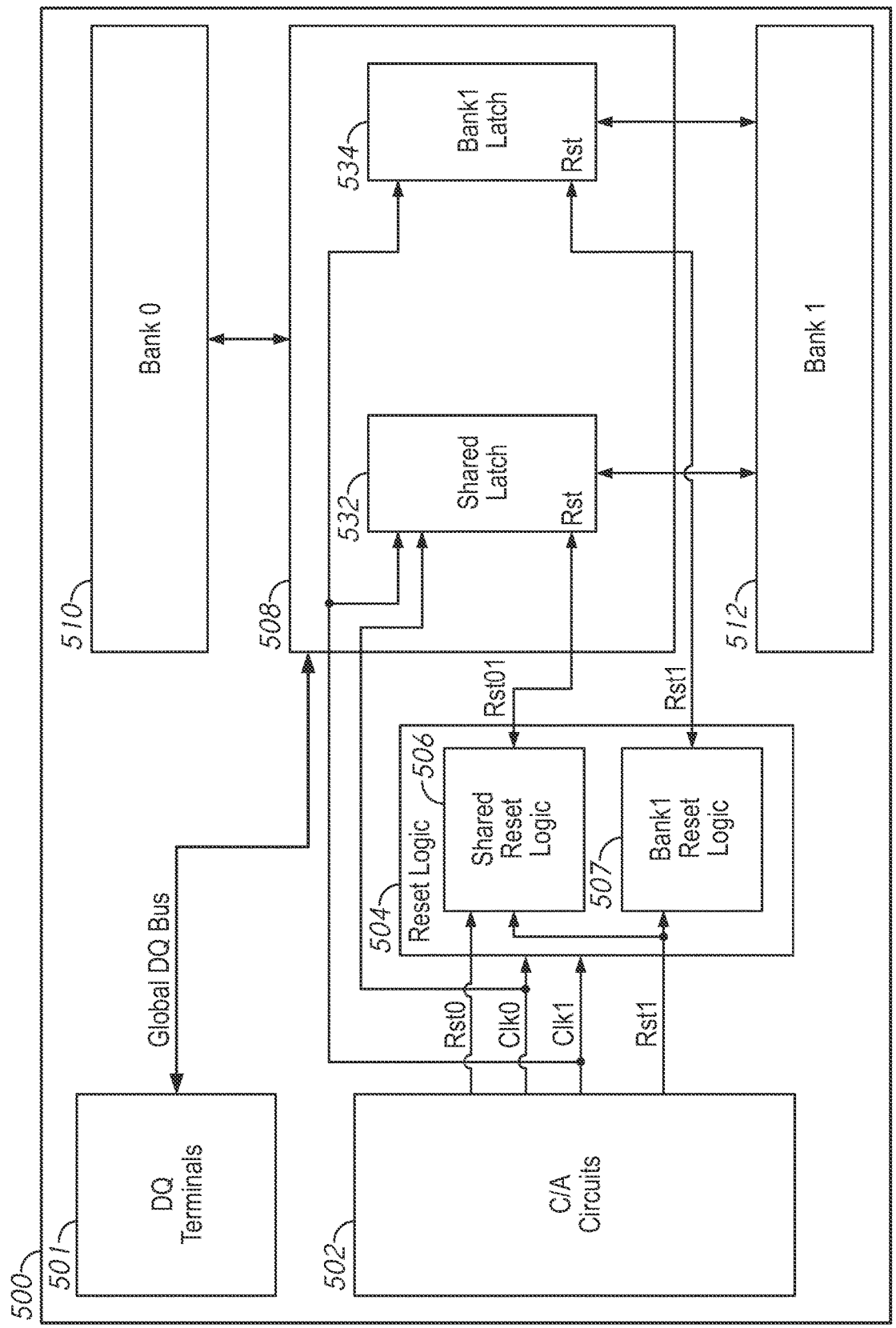
FIG. 5 is a block diagram of a memory with a shared latch and a non-shared latch according to some embodiments of the present disclosure.

FIG. 5 is a block diagram of a memory with a shared latch and a non-shared latch according to some embodiments of the present disclosure. The memory 500 of FIG. 5 may, in some embodiments, be included in the memories 100, 200, 300 and/or 400 of FIGS. 1-4 respectively. For the sake of brevity, features and operations previously described with respect to the memory 400 of FIG. 4, the memory 300 of FIG. 3, the memory 200 of FIG. 2 and/or the memory device 100 of FIG. 1 will not be repeated again with respect to FIG. 5. The memory 500 of FIG. 5 shows a set of local latches 508 which includes a shared latch 532 which is shared between the two banks 510 and 512 and a local latch 534 which is not shared between the banks. In some embodiments, the local latches 508 may represent read latches (e.g., 434 of FIG. 4) or write latches (e.g., 432 of FIG. 4).

The reset logic 504 includes shared reset logic 506 and bank specific reset logic 507. The shared reset logic 506 may function in a manner generally similar to the reset logic 304 of FIG. 3. The shared reset logic 506 provides a combined reset signal Rst01 when either of the two reset signals Rst0 or Rst1 are active, with timing based in part on the clock signals Clk0 and Clk1. The bank specific reset logic 507 may provide the reset signal Rst1, which may have timing influenced by the block signal Clk1. In some embodiments, the bank specific reset logic 507 may be omitted, and the reset signal Rst1 may be passed directly from the C/A circuits 502 to the local latch 534. In some embodiments, where waveforms of a row active signal are used, the bank specific reset logic 507 may receive the row active signal and may generate a reset signal Rst1 based on the row active signal.

The shared latch 532 is coupled to the clock signals Clk0 and Clk1 and to the combined reset signal Rst01. The non-shared latch 534, which in this example is associated with the second bank 512, is coupled to the clock signal Clk1 and the reset signal Rst1. The shared local latch 532 may store data (e.g., either from one of the banks 510/512 or the global DQ bus) when either the clock Clk0 or Clk1 is active, and may reset based on the combined reset signal Rst01. The non-shared latch 534 may store data (e.g., from the second bank 512 or the global data bus) responsive to an activation of the clock Clk1 and may reset based on the reset signal Rst1.

A set of local latches 508 may, in some embodiments, include various mixes of shared and non-shared local latches. While only a single example shared latch 532 and non-shared latch 534 are shown, the local latches 508 may include any number of shared and non-shared latches. Similarly, while the non-shared latch 534 is coupled to the second bank 512, the local latches 508 may include latches coupled to the first bank 510, latches coupled to the second bank 512, or a mix of latches coupled to each bank. For example, the local latches 508 may include read latches which are shared, but separate write latches for the first bank 510 and the second bank 512 (or shared write latches but non-shared read latches).

Figure 6:
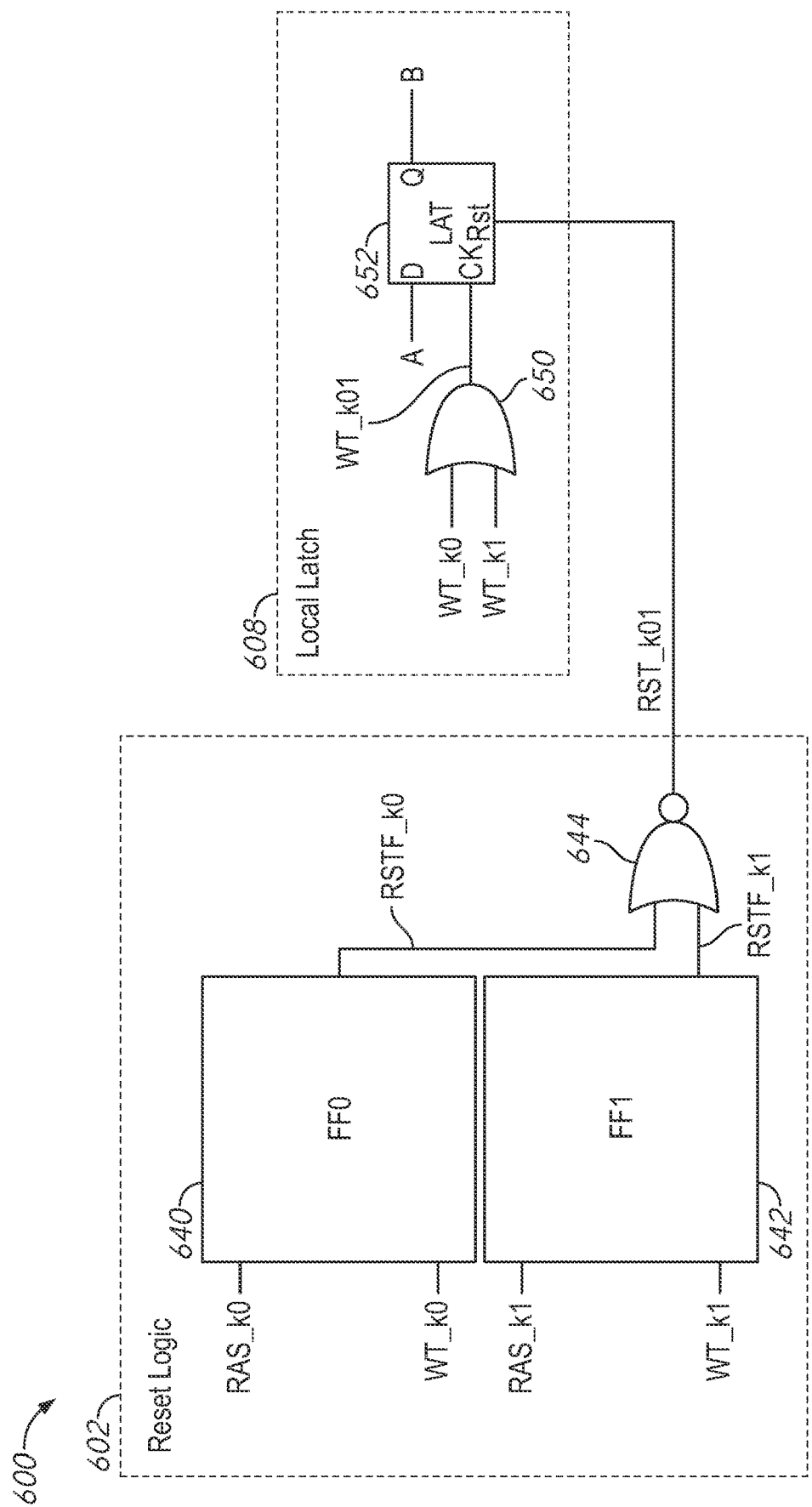
FIG. 6 is a schematic diagram of reset logic and a local latch according to some embodiments of the present disclosure.

FIG. 6 is a schematic diagram of reset logic and a local latch according to some embodiments of the present disclosure. The reset logic 602 may, in some embodiments, be included in the reset logic 204/205 of FIG. 2, 304 of FIG. 3, 404 of FIG. 4, and/or 504 of FIG. 5. Similarly, the local latch 608 may, in some embodiments, be included in the local latch 208/209 of FIG. 2, 308 of FIG. 3, 408 of FIG. 4, and/or 508 of FIG. 5. In particular, the reset logic 602 of FIG. 6 may represent write reset logic (e.g., 406 of FIG. 4) and the local latch 608 may be a write local latch (e.g., 432 of FIG. 4). It should be understood that other types of reset logic and shared latches, such as read reset logic and latches, may generally be similar to the logic 602 and latch 608. In some embodiments, different types of reset logic and latches may be distinguished by the clock signals they are coupled to. For example, while the reset logic 602 is coupled to write clocks WT_k0 and WT_k1 associated with a first and second bank, respectively, read logic may be analogous to the reset logic 602 but coupled to read signals RD_k0 and RD_k1 instead.

The reset logic 602 includes a first flip-flop (FF) circuit 640 and a second FF circuit 642. The first FF circuit 640 has inputs coupled a first row active command RAS_k0 and a first write clock WT_k0 (e.g., a column active command), both of which are associated with operations in a first bank. The signal RAS_k0 being at an active level may be associated with access operations in the first bank (e.g., bank0). The signal RAS_k0 falling to an inactive level may indicate that access operations are over. Accordingly, the falling edge of RAS_k0 may act as the reset signal (e.g., a falling edge of RAS_k0 may be analogous to an activation of Rst0 of FIGS. 1-5). The second FF circuit 642 may be coupled to a second row active command RAS_k1 and a second write clock WT_k1 (e.g., a column access signal), both of which are associated with operations in a second bank. A falling edge of RAS_k1 may act as a second reset signal. In some embodiments, the first and the second FF circuit 640 and 642 may generally be similar to each other. In some embodiments, the first and the second FF circuit 640 and 642 may be structurally identical, but coupled to different inputs.

The first FF circuit 640 provides a first inverse reset signal RSTF_k0 and the second FF circuit 642 provides a second inverse reset signal RSTF_k1. The inverse reset signals RSTF_k0 and RSTF_k1 may generally be active when the reset signal is not being provided. A logic gate, such as NOR gate 644 provides the combined reset signal RST_k01 (e.g., analogous to Rst01 of FIGS. 1-5) based on the two inverse reset signals RSTF_k0 and RSTF_k1. When both of the inputs of one of the FF circuits 640 and 642 become active, the output signal may become active until the first input becomes inactive. For example, when the first FF circuit 640 receives both RAS_k0 and WT_k0 at an active level, the output RSTF_k0 may switch to an active level. The signal RSTF_k0 may remain at an active level for as long as RAS_k0 is at an active level. When the signal RAS_k0 falls to an inactive level, the signal RSTF_k0 may also fall to an inactive level to indicate that a reset signal should be provided to the local latch 608.

The logic gate 644 may be a NOR gate, which provides the overall combined reset signal RST_k01 at an active level (e.g., a high logical level) when both the inverse signals RSTF_k0 and RSTF_k1 are inactive (e.g., a low logical level). Accordingly when one of the clock signals WT_k0 or WT_k1 becomes active, the associated inverse reset signal (RSTF_k0 or RSTF_k1) may become active, which in turn may cause the combined signal RST_k01 to become inactive.

The local latch 608 is shown as including clock logic, which in this example is an OR gate 650. The OR gate 650 receives the two clock signals WT_k0 and WT_k1 and provides the combined clock signal WT_k01. When either the first clock signal WT_k0 or the second clock signal WT_k1 is active, the combined clock signal WT_k01 may be active. The combined clock signals WT_k01 is provided to a clock terminal CLK of a shared latch 652. A reset terminal RST of the shared latch 652 is coupled to the combined reset signal RST_k01. The data terminal D of the latch 652 is coupled to a first signal A, which may be part of the global data bus. The output terminal Q of the latch 652 is coupled to a signal B, which may be provided to the two banks coupled to the shared latch 652.

Figure 7:
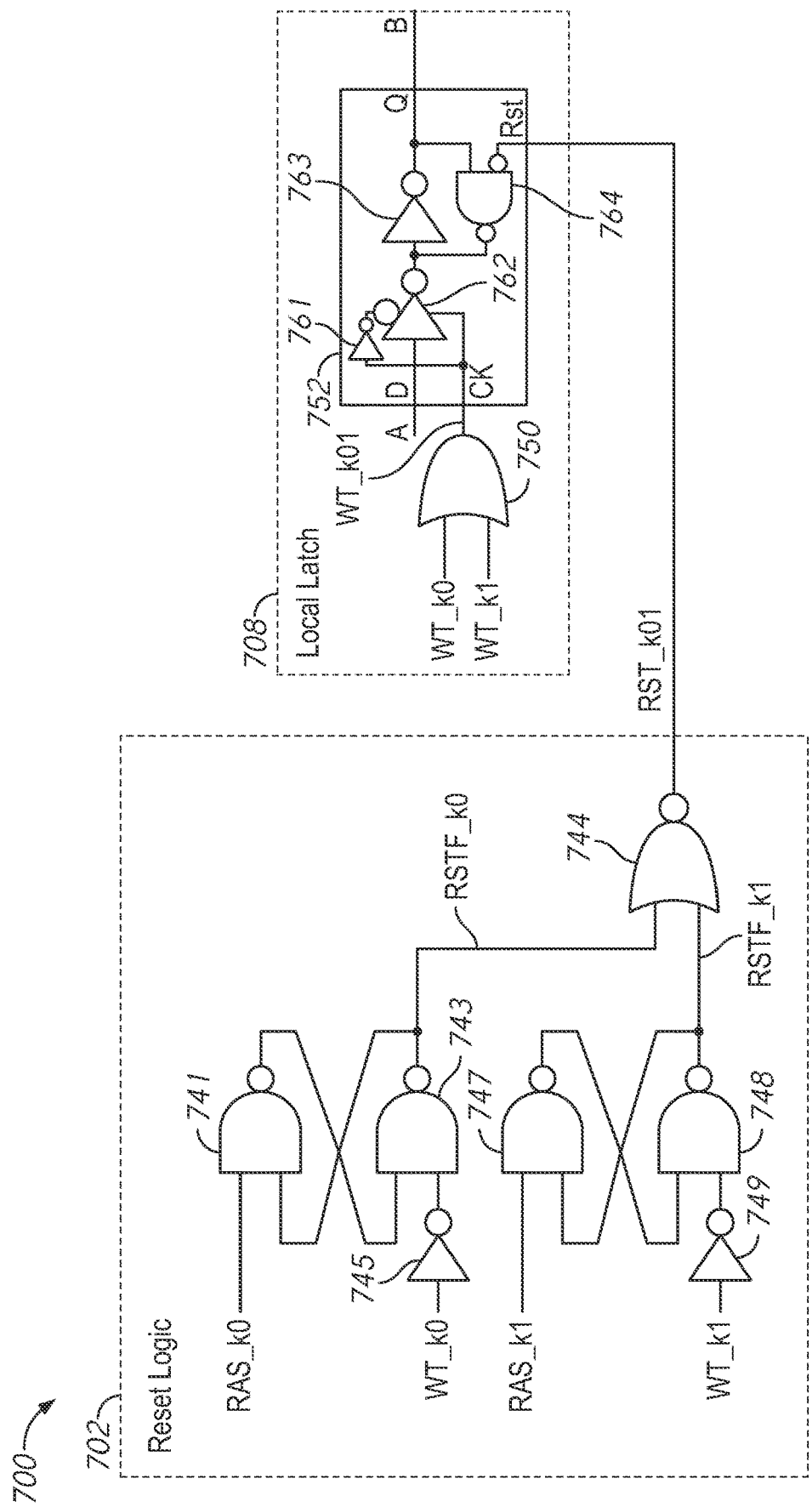
FIG. 7 is a schematic diagram of reset logic and a local latch according to some embodiments of the present disclosure.

FIG. 7 is a schematic diagram of reset logic and a local latch according to some embodiments of the present disclosure. The reset logic 702 may, in some embodiments, be included in the reset logic 204/205 of FIG. 2, 304 of FIG. 3, 404 of FIG. 4, 504 of FIG. 5, and/or 602 of FIG. 6. Similarly, the local latch 708 may, in some embodiments, be included in the local latch 208/209 of FIG. 2, 308 of FIG. 3, 408 of FIG. 4, 508 of FIG. 5, and/or 608 of FIG. 6. The reset logic 702 and local latch 708 may be an implementation of the reset logic 602 of FIG. 6 and local latch 608 of FIG. 6. For the sake of brevity, details and operations already described in regards to FIG. 6 won't be repeated with respect to FIG. 7.

The reset logic 702 includes a first flip flop circuit (e.g., 640 of FIG. 6) which includes a first NAND gate 741, a second NAND gate 743 and an inverter 745. The first NAND gate has a first input terminal coupled to RAS_k0 and a second input terminal coupled to RSTF_k0. The second NAND gate 743 has a first input terminal coupled to the output of the first NAND gate 741 and a second input terminal coupled through the inverter circuit 745 to WT_k0. The output of the second NAND gate 743 is the signal RSTF_k0. The second flip-flop circuit may generally be similar, with NAND gates 747 and 748 and inverter 749.

The latch 752 includes a first, second, and third inverter 761-763 and a NAND gate 764. The second inverter 762 has an input terminal coupled to the input D of the latch 752. The second inverter also has a first power terminal coupled to the clock terminal CK through the first inverter 761 and a second power terminal coupled to the clock terminal CK of the latch 752. The output of the second inverter 762 is provided to a node which is coupled to an input of the third inverter 763, which has an output provided to the output terminal Q of the latch 752. The output terminal Q is also coupled to one of the inputs of the NAND gate 764. The other input terminal of the NAND gate 764 may be an inverting input, which is coupled to the reset terminal Rst of the latch 752. The output of the NAND gate 764 is coupled to the node between the second and third inverter 762 and 763.

FIG. 8 is a timing diagram of an example operation of reset logic and a reset latch according to some embodiments of the present disclosure. The timing diagram 800 may, in some embodiments, represent the operation of the reset logic 204/205 of FIG. 2, 304 of FIG. 3, 404 of FIG. 4, 504 of FIG. 5, 602 of FIG. 6, and/or 702 of FIG. 7. In particular, the timing diagram may use the signal names of FIGS. 6 and 7.

The different races of the timing diagram 800 show the signals which may be used by the reset logic, as well as the input data A and output data B and the combined clock signal WT_k01. Except for the data A and B, the signals are represented as idealized binary signals, which have a low logical level (e.g., an inactive state) and a high logical level (e.g., an active state).

At an initial time t0, the second write clock WT_k1 rises to an active level. The signal RAS_k1 may have already risen to an active level at a time before the initial time t0, and may remain at the active level at the time t0. Since the signals RAS_k1 and WT_k1 are both at an active level, the first flip flop circuit (e.g., 640 of FIG. 6) may switch to providing the signal RSTF_k1 at an active level. At the initial time t0, the signals associated with the first bank (RAS_k0 and WT_k0) may both be inactive, so the signal RSTF_k0 may also be inactive. Accordingly, at the initial time t0, since RSTF_k0 is inactive but RSTF_k01 is active, the combined reset signal RST_k01 may switch from active to inactive. Since one of the clock signals (WT_k1) is active, the combined clock signal WT_k01 may become active at the time t0, which may cause the local latch to latch the value of the signal A, and provide that latched value as the signal B. Since the example of the timing diagram 800 is for a write operation, the local latch may receive information A from the global DQ bus, and provide it as the signal B to the active bank (which at t1 is the second bank).

At some point after the time t0 (but before a first time t1), the signal RAS_k1 may fall from the active to the inactive state. The transition of RAS_k1 from active to inactive may act as the reset signal (e.g., an activation of Rst1). This may cause the signal RSTF_k1 to also fall to an inactive state, which in turn causes the combined reset signal RST_k01 to rise to an active level. This may cause the local latch to reset, losing the previously saved value of the signal A. Between the times t0 and t1, the signal RAS_k0 may rise to an active level, but since the clock WT_k0 does not activate until the time t1, the change in RAS_k0 may not affect the value of the signal RSTF_k0 until the time t1.

At the time t1, the clock signal WT_k0 becomes active. Since the signal RAS_k0 is already active, this may cause the inverse reset signal RSTF_k0 to become active. Since one of the inverse reset signals is active, the combined reset signal may become inactive. Since one of the clocks is active (WT_k0), the combined clock WT_k01 may become active. Accordingly, the local latch may latch a new value of the signal A and provide the new stored value as the signal B. In this case, since the clock signal WT_k0 is associated with the first bank (e.g., Bank0), the local latch may provide the value to the first bank.

At a second time t2, the signal RAS_k0 may fall to an inactive level. The falling edge of RAS_k0 may act as an activation of a reset signal (e.g., Rst0). The falling edge of RAS_k0 may cause the inverse reset signal RSTF_k0 to fall to an inactive level. Since at t2 both the inverse reset signals RSTF_k0 and RSTF_k1 are inactive, the reset signal RST_k01 may become active. The signal RSTF_k0 becoming active may cause the local latch to reset.

At a third time t3, the clock signal WT_k1 may become active. Since the signal RAS_k1 is active at the time t3, the signal RSTF_k1 may rise to the active level. The signal RSTF_k1 being active may, in turn, cause the combined reset signal RST_k01 to become inactive again. In this manner, even though the time between t2 and t3 is relatively short, an activation of RST_k01 is properly provided, and ended when the clock WT_k1 activates at t3.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a latch circuit configured to store data associated with a first memory bank or a second memory bank, and configured to reset the data responsive to a combined reset signal; and
a reset logic circuit configured to receive a first clock signal and a first reset signal associated with the first memory bank and a second clock signal and a second reset signal associated with the second memory bank, and configured to provide the combined reset signal based on the first reset signal and the second reset signal wherein the combined reset signal is not active while the first clock signal or the second clock signal is active.

2. The apparatus of claim 1, wherein the first clock signal is associated with access operations in the first memory bank and the second clock signal is associated with access operations in the second memory bank.

3. The apparatus of claim 1, wherein the first reset signal is a falling edge of a first access signal associated with the first memory bank and the second reset signal is a falling edge of a second access signal associated with the second memory bank.

4. The apparatus of claim 1, wherein the reset logic comprises:
a first latch configured to receive the first reset signal and the first clock signal and provide a first inverse reset signal;
a second latch circuit configured to receive the second reset signal and the second clock signal and provide a second inverse reset signal; and
a logic circuit configured to provide the combined reset signal an active level when both of the first and the second inverse reset signals are inactive.

5. The apparatus of claim 1, wherein the reset logic is configured to set the combined reset signal to an inactive level responsive to a rising edge of the first clock signal or the second clock signal.

6. The apparatus of claim 1, wherein the local latch is configured to store the data responsive to the first clock signal or the second clock signal.

7. The apparatus of claim 1, wherein the local latch is a write local latch configured to receive data from a global data bus and provide the received data to the first memory bank or the second memory bank.

8. A method comprising:
storing stored data in a local latch responsive to a first clock signal or a second clock signal at an active level, wherein the stored data is associated with a first memory bank or a second memory bank;
resetting the stored data responsive to a combined reset signal at an active level;
providing the combined reset signal at an active level based on an activation of a first reset signal associated with the first memory bank and a second reset signal associated with the second memory bank; and
inactivating the combined reset signal when the first clock signal or the second clock signal rises to the active level.

9. The method of claim 8, further comprising:
accessing the first memory bank based on a first access signal and the first clock signal, wherein the first reset signal is a falling edge of the first access signal; and
accessing the second memory bank based on a second access signal and the second clock signal, wherein the second reset signal is a falling edge of the second access signal.

10. The method of claim 8, further comprising storing write data in the local latch and writing the stored write data to the first memory bank or the second memory bank.

11. The method of claim 8, further comprising storing read data from the first memory bank or the second memory bank in the local latch and providing the stored read data to a global data bus.

12. The method of claim 8, further comprising:
providing a first inverse reset signal with a level based on the first reset signal and the first clock signal;
providing a second inverse reset signal with a level based on the second reset signal and the second clock signal; and
providing the combined reset signal at the active level when both the first inverse reset signal and the second inverse reset signal are at an inactive level.

13. The method of claim 12, further comprising:
providing the first inverse reset signal at an active level when the first clock signal rises to an active level; and
providing the second inverse reset signal at an active level when the second clock signal rises to an active level.

14. An apparatus comprising:
a first latch circuit configured to receive a first access signal and a first clock signal and provide a first inverse reset signal based on the first access signal and the first clock signal, wherein the first inverse reset signal is at an active level when the first clock signal is active;
a second latch circuit configured to receive a second access signal and a second clock signal and provide a second inverse reset signal based on the second access signal and the second clock signal, wherein the second inverse reset signal is at an active level when the second clock signal is active; and
a logic circuit configured to provide a combined reset signal at an active level when both the first inverse reset signal and the second inverse reset signal are at the inactive level; and
a local latch configured to store data and reset the stored data responsive to the combined reset signal at the active level.

15. The apparatus of claim 14, wherein the first access signal and the first clock signal are associated with access operations in a first memory bank, and the second access signal and the second clock signal are associated with access operations in a second memory bank.

16. The apparatus of claim 15, wherein the stored data in the local latch is associated with the first memory bank or the second memory bank.

17. The apparatus of claim 14, wherein the first latch circuit and the second latch circuit are flip-flop (FF) circuits.

18. The apparatus of claim 14, wherein a falling edge of the first access signal represents a first reset signal and wherein a falling edge of the second access signal represents a second reset signal.

19. The apparatus of claim 14, wherein the first latch circuit is further configured to provide the first inverse reset signal at the active level when both the first access signal and the first clock signal are active and provide the first inverse reset signal at the inactive level when the first access signal falls to the inactive level; and
wherein the second latch circuit is further configured to provide the second inverse reset signal at the active level when both the second access signal and the second clock signal are active and provide the second inverse reset signal at the inactive level when the second access signal falls to the inactive level.

20. The apparatus of claim 14, wherein the combined reset signal becomes inactive when either the first or the second clock signal becomes active.

* * * * *